(12) United States Patent
Noda et al.

(10) Patent No.: US 7,018,864 B2
(45) Date of Patent: Mar. 28, 2006

(54) CONDUCTIVE PASTE FOR TERMINAL ELECTRODES OF MONOLITHIC CERAMIC ELECTRONIC COMPONENT, METHOD FOR MAKING MONOLITHIC CERAMIC ELECTRONIC COMPONENT, AND MONOLITHIC CERAMIC ELECTRONIC COMPONENT

(75) Inventors: Satoru Noda, Hikone (JP); Takeshi Miki, Omihachiman (JP); Kunihiko Hamada, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/849,129

(22) Filed: May 20, 2004

(65) Prior Publication Data

US 2004/0214418 A1   Oct. 28, 2004

Related U.S. Application Data

(62) Division of application No. 10/247,518, filed on Sep. 20, 2002, now abandoned.

(30) Foreign Application Priority Data

Sep. 20, 2001  (JP) .............................. 2001-287487
Jun. 13, 2002  (JP) .............................. 2002-172870

(51) Int. Cl.
*H01L 51/40*      (2006.01)

(52) U.S. Cl. ......................................... 438/99; 257/678

(58) Field of Classification Search ................ 438/99, 438/26, 51, 54, 64, 106, 100; 257/678, 743, 257/744, 745, 762, 766
See application file for complete search history.

(56) References Cited

U.S. PATENT DOCUMENTS

| 4,983,196 | A | * | 1/1991 | Stotka ........................... 65/24 |
| 5,141,798 | A | * | 8/1992 | Chaumonot et al. ......... 428/195 |
| 5,350,718 | A | * | 9/1994 | Anquetil et al. .............. 501/21 |
| 5,782,945 | A | * | 7/1998 | Gavin et al. ................. 65/60.1 |

FOREIGN PATENT DOCUMENTS

| JP | 2000-100653 | 4/2000 |
| JP | 2001-122639 | 5/2001 |

OTHER PUBLICATIONS

Copy of Japanese Examination Report dated Oct. 18, 2005.

* cited by examiner

*Primary Examiner*—David Nhu
(74) *Attorney, Agent, or Firm*—Dickstein, Shapiro, Morin & Oshinsky, LLP.

(57) ABSTRACT

A conductive paste for forming terminal electrodes of a monolithic ceramic electronic component having nickel internal electrodes is provided. The conductive paste includes at least one of a silver powder and a silver alloy powder, a boron powder, an inorganic binder and an organic vehicle. The amount of the boron powder is at least about 0.5 percent by weight and less than about 7.0 percent by weight of the total weight of the conductive paste.

17 Claims, 2 Drawing Sheets

CONDUCTIVE PASTE FOR TERMINAL ELECTRODES OF MONOLITHIC CERAMIC ELECTRONIC COMPONENT, METHOD FOR MAKING MONOLITHIC CERAMIC ELECTRONIC COMPONENT, AND MONOLITHIC CERAMIC ELECTRONIC COMPONENT

This is a division of application Ser. No. 10/247,518, filed Sep. 20, 2002 now abandoned.

BACKGROUND OF THE INVENTION

1. Field of the Invention

The present invention relates to a conductive paste for forming terminal electrodes of a monolithic ceramic electronic component such as a monolithic capacitor or a monolithic positive temperature coefficient (PTC) thermistor. It also relates to a monolithic ceramic electronic component using the conductive paste and to a method for making the monolithic ceramic electronic component.

2. Description of the Related Art

Conventionally, internal electrodes of a monolithic ceramic capacitor, i.e., an example of a monolithic ceramic electronic component, have been made of silver, silver-palladium, or the like. However, since these materials are expensive, nickel, which is a relatively inexpensive base metal, has replaced these materials.

On the other hand, terminal electrodes of a monolithic ceramic capacitor are composed of silver, which exhibits superior conductivity and can be baked at low temperatures. The silver terminal electrodes are coated with a nickel layer and then a tin layer or a solder layer to improve the solderability and to obtain a monolithic ceramic capacitor.

The internal electrodes of a monolithic PTC thermistor, which is another example of a monolithic ceramic electronic component, are made of nickel which makes an ohmic contact to a ceramic, i.e., an n-type impurity semiconductor. A PTC thermistor having a desired positive resistance temperature characteristic is made by simultaneously baking stacked ceramic green sheets and internal electrodes in a reducing atmosphere and subsequently forming terminal electrodes by baking in air while reoxidizing the ceramic.

However, nickel and silver do not form a solid solution. Thus, a monolithic ceramic capacitor having nickel internal electrodes and silver terminal electrodes suffers from a problem in that the bonding of the internal electrodes to the terminal electrodes is difficult, thereby often failing to obtain a desired capacitance.

In view of the above problem, copper which forms a complete solid solution with nickel has drawn much attention as a material of the terminal electrodes. However, since copper is easily oxidized, baking of the copper-containing conductive paste to form terminal electrodes must be performed in a reducing atmosphere. Such a process increases the manufacturing cost. Moreover, since the oxygen concentration in the reducing atmosphere is low, the decomposition rate of the vehicle contained in the conductive paste is also low. As a result, the characteristics of the product may be affected by the residual carbon.

As with the monolithic ceramic capacitor, a monolithic PTC thermistor having terminal electrodes composed of silver, which can be baked in air, suffers from a problem in that silver does not form a solid solution with nickel in the internal electrodes, thereby inhibiting bonding of the internal electrode to the terminal electrode. Other examples of the terminal electrode paste that can be baked in air include an aluminum paste and a zinc paste. However, electrodes made of aluminum or zinc have poor solderability and suffer from the problem that aluminum or zinc in the electrode elutes into a plating solution when electrolytic plating is performed onto the electrodes.

SUMMARY OF THE INVENTION

It is an object of the present invention to provide a silver conductive paste for forming terminal electrodes of a monolithic ceramic electronic component, such as a monolithic ceramic capacitor and a monolithic PTC thermistor, that has nickel internal conductors. With the silver conductive paste of the present invention, the oxidation of the surface of the nickel internal conductors can be prevented and a satisfactory connection between the terminal electrodes and the internal conductors can be achieved even when the terminal electrode are baked in air. Another object of the present invention is to provide a method for making a monolithic ceramic electronic component having terminal electrodes made from this conductive paste, and to provide a monolithic ceramic electronic component.

To attain these objects, a first aspect of the present invention provides a conductive paste for forming terminal electrodes of a monolithic ceramic electronic component, including: at least one of a silver powder and a silver alloy powder; a boron powder; an inorganic binder; and an organic vehicle. The amount of the boron powder is at least about 0.5 percent by weight and less than about 7.0 percent by weight of the total weight of the conductive paste.

A second aspect of the present invention provides a method for making a monolithic ceramic electronic component, the method including the steps of: preparing ceramic green sheets; forming a precursor of an internal conductor layer of nickel or a material containing nickel as the primary component on each of the ceramic green sheets; stacking the ceramic green sheets to form a composite; sintering the composite to obtain a sintered compact having the internal conductor layers; and applying the conductive paste of the invention to the sintered compact and baking the conductive paste to form terminal electrodes electrically connected to the internal conductor layers of the sintered compact.

A third aspect of the present invention provides a monolithic ceramic electronic component made by the method described above.

In one preferred embodiment, the ceramic green sheets are dielectric, and the monolithic ceramic electronic component is a monolithic ceramic capacitor.

In another preferred embodiment, the ceramic green sheets are semiconductive and the monolithic ceramic electronic component is a monolithic positive temperature coefficient thermistor.

DESCRIPTION OF THE PREFERRED EMBODIMENTS

Figure 1:
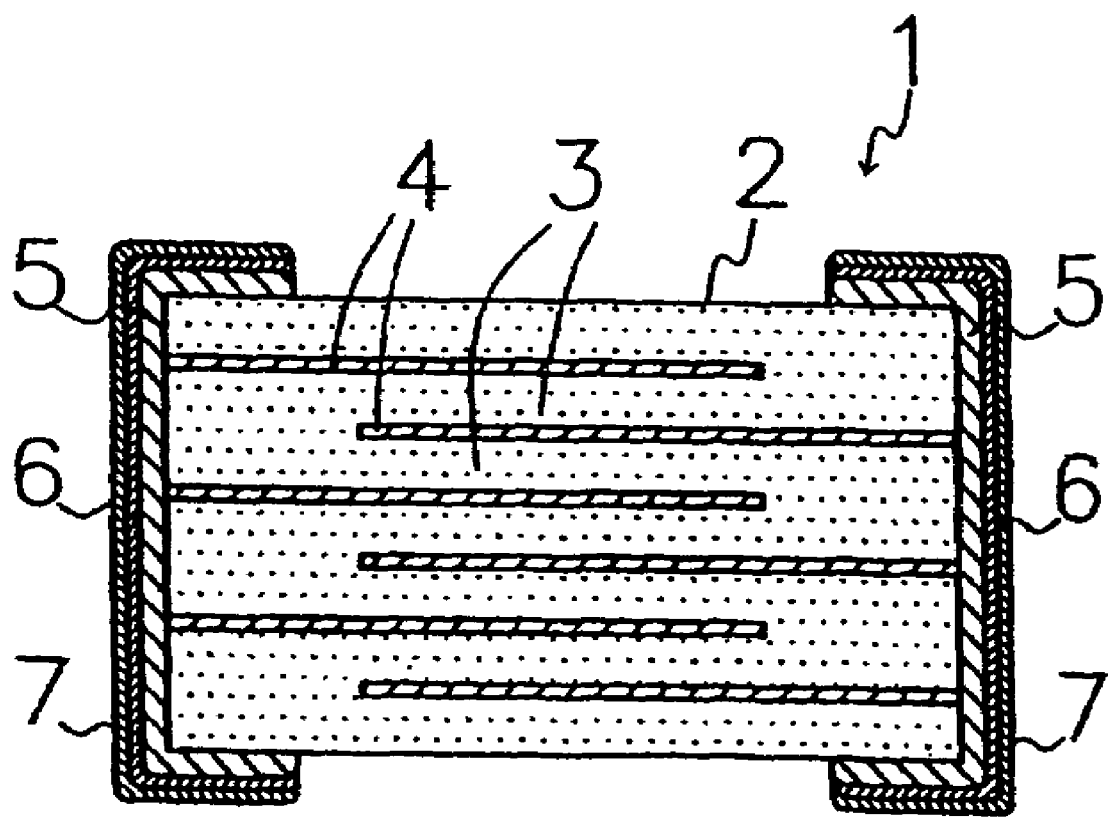
FIG. 1 is a cross-sectional view of a monolithic ceramic capacitor which is an example of a monolithic ceramic electronic component of the present invention.

A conductive paste for forming terminal electrodes of a monolithic ceramic electronic component according to the present invention contains: at least one of a silver powder and a silver alloy powder; a boron powder; an inorganic binder; and an organic vehicle. The amount of the boron powder in the total conductive paste is at least about 0.5 percent by weight but less than about 7.0 percent by weight.

The conductive paste for terminal electrodes of the present invention contains at least one of a silver powder and a silver alloy powder as the conductive powder, and can be baked in air. When the conductive paste is applied on the sintered monolithic ceramic compact having nickel internal electrodes so that a connection to the nickel internal electrodes are formed, the boron powder contained in the conductive paste prevents the oxidation of nickel in the internal electrodes. Moreover, although nickel in the internal electrodes and silver in the terminal electrodes do not form a solid solution by themselves, the presence of boron enables nickel in the internal electrode and silver in the terminal electrode to form a solid solution.

When boron oxide ($B_2O_3$) or boric acid ($H_3BO_3$) is used instead of semimetal boron (B), oxidation of nickel in the internal-electrode can still be prevented if they are added in the same amount, on a boron basis, as that of boron. However, it has been found that neither boron oxide nor boric acid enables formation of a nickel-silver solid solution. Thus, a semimetal boron powder must be used.

The amount of the boron powder is preferably at least about 0.5 percent by weight. At an amount of less than about 0.5 percent by weight, an oxide film is formed on the nickel internal electrode, thereby generating an electrical contact resistance. At an amount of about 7.0 percent by weight or more, the conductivity of the baked layer decreases.

Preferably, the average particle diameter of the boron powder is about 60 µm or less. At a diameter exceeding about 60 µm, boron is likely to remain in the baked electrode film in an uneven manner, thereby decreasing the conductivity.

The organic binder is preferably bismuth borate glass, bismuth borosilicate glass, or zinc borosilicate glass in view of environmental concerns since these glasses are lead free.

As for the viscosity of the glass at high temperatures, the working point (log η (Pa.s)=4) is preferably about 600° C. or less, and more preferably, the baking temperature is about 900° C. or less. This is because the conductive paste of the present invention is baked in air at a temperature of about 400 to 900° C. If the baking temperature is less than about 400° C., silver and nickel do not form a solid solution, and thus the resulting terminal electrodes cannot be satisfactorily bonded to the nickel internal electrodes. In contrast, at a baking temperature exceeding about 900° C., the sintering reaction of the silver powder or the silver alloy powder becomes excessive, thereby failing to obtain uniform electrode layers.

The amount of the inorganic binder is preferably about 1 to 20 percent by volume of the total volume (solid component volume) of the silver powder and/or the silver alloy powder, the inorganic binder, and the boron powder. At an amount of less than about 1 percent by volume, the adhesiveness of the baked electrode is decreased. At an amount exceeding about 20 percent by volume, the baked electrode does not exhibit conductivity.

A method for making a monolithic ceramic electronic component of the present invention includes: preparing a ceramic stack having internal conductors made of nickel or mainly made of nickel; and applying the above-described conductive paste for forming terminal electrodes on the ceramic stack and baking the conductive paste to form terminal electrodes.

A method of the present invention will now be described with reference to FIG. 1 using a monolithic ceramic capacitor 1 as an example of the monolithic ceramic electronic component.

First, a dielectric ceramic powder, such as a $BaTiO_3$ system powder, is prepared. After the dielectric ceramic powder is made into a slurry, the slurry is formed into ceramic green sheets which are precursors of dielectric ceramic layers 3.

Next, a precursor of an internal conductor layer for making an internal electrode 4 is formed on each of the ceramic green sheets by screen-printing or the like. The internal electrode 4 is composed of nickel or a material containing nickel as the primary component. A required number of ceramic green sheets with the precursors of the internal conductor layers thereon are stacked, and a ceramic green sheet not provided with the precursor of the internal conductor layer is placed on the top of the stack. The stacked ceramic green sheets are then press-bonded to prepare a green composite.

The green composite is baked at a predetermined temperature in a predetermined nonoxidative atmosphere to prepare a sintered compact 2.

Terminal electrodes 5 are formed on the two side faces of the sintered compact 2 to obtain a monolithic ceramic capacitor. Each of the terminal electrodes 5 is electrically connected to corresponding internal electrodes 4. The terminal electrodes 5 are formed by applying the above-described conductive paste of the present invention on the two side faces of the compact and baking the applied conductive paste.

Subsequently, a plating layer 6 composed of nickel, copper or the like, is formed on each of the terminal electrodes 5, and a plating layer 7 composed of solder, tin or the like, is formed on the plating layer 6, if necessary.

Figure 2:
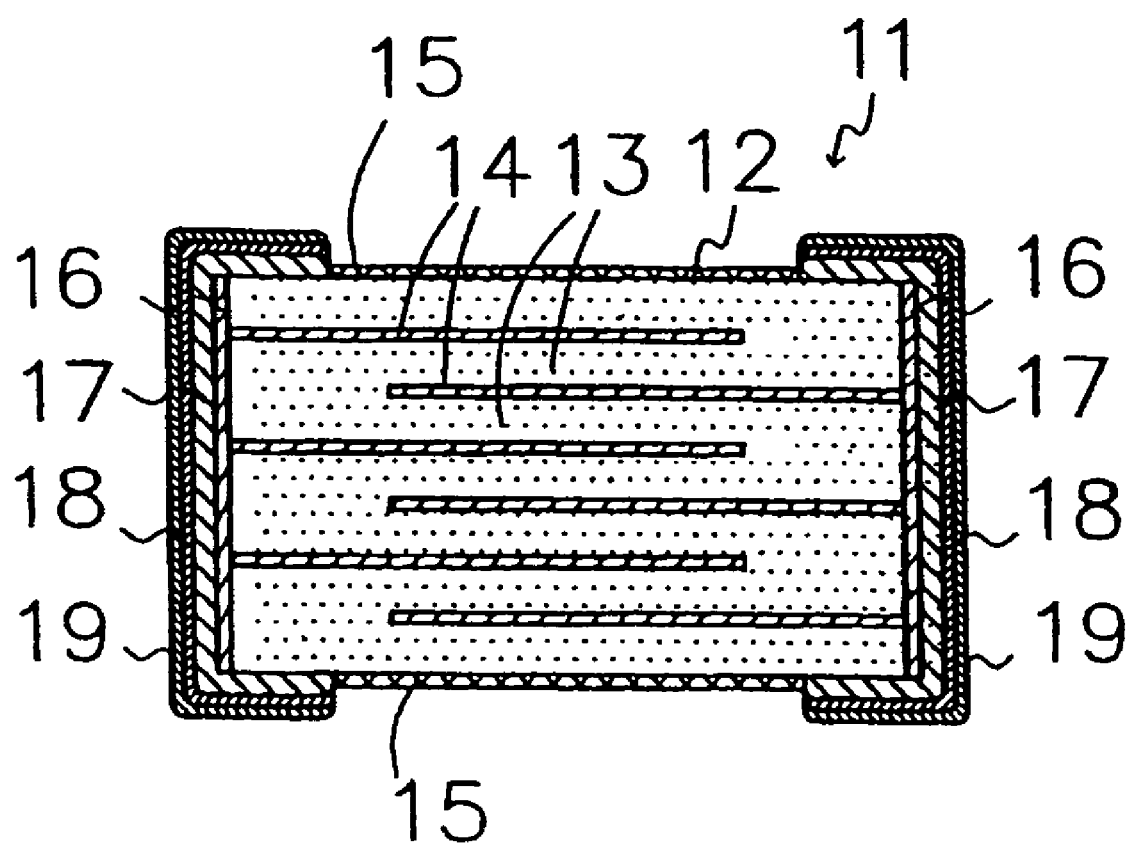
FIG. 2 is a cross-sectional view of a monolithic positive temperature coefficient thermistor which is another example of the monolithic ceramic electronic component of the present invention.

FIG. 2 shows a PTC thermistor, which is another example of the monolithic ceramic electronic component of the present invention.

A PTC thermistor 11 includes a sintered compact 12 including stacked semiconductor ceramic layers 13 and nickel internal electrodes 14 formed at corresponding interfaces between the semiconductor ceramic layers 13. Terminal electrodes 17 are formed at the side faces of the sintered compact 12 so that each of the terminal electrodes 17 is connected to corresponding internal electrodes 13.

Unlike the monolithic ceramic capacitor 1 described above, the PTC thermistor 11 has surfaces covered with a glass layer 15. Moreover, side electrodes 16 composed of nickel, which is the same material as the internal electrodes, are provided so that the internal electrodes 14 are securely connected to the side electrodes 16. The conductive paste of the present invention is applied on the side electrodes 16 and is baked to form the terminal electrodes 17.

A plating layer 18 composed of nickel is formed on each of the terminal electrodes 17, and a plating layer 19 composed of solder, tin or the like, is formed on each of the terminal electrodes 17, if necessary.

EXAMPLES

Example 1

Example 1 is explained below using a monolithic ceramic capacitor as an example of the monolithic ceramic electronic component.

Predetermined amounts of starting materials, i.e., $TiCl_4$ and $Ba(NO_3)_2$ were allowed to react with oxalic acid to obtain a barium titanyl oxalate $(BaTiO(C_2O_4).4H_2O)$ residue. The residue was pyrolyzed at a temperature of 1,000° C. or more so as to synthesize the main component, i.e., $BaTiO_3$.

Suitable oxides, carbonates or hydroxides of the components described below were mixed and milled so as to obtain a powder having a composition of 0.25 $Li_2O$-0.65(0.30 $TiO_2$.0.70 $SiO_2$)-0.10 $Al_2O_3$ on a molar ratio basis. This powder mixture was heated to 1,500° C. in a platinum crucible, was quenched, and was milled to obtain an oxide powder having an average particle diameter of 1 μm or less. This oxide powder was a first auxiliary component.

Suitable oxides, carbonates or hydroxides of the components described below were mixed and milled so as to obtain a powder having a composition of 0.66 $SiO_2$-.0.17 $TiO_2$-0.15 BaO-0.02 MnO on a molar ratio basis. This powder mixture was heated to 1,500° C. in a platinum crucible, was quenched, and was milled to obtain an oxide powder having an average particle diameter of 1 μm or less. This oxide powder was a second auxiliary component.

Next, the main component, the first auxiliary component, and the second auxiliary component were mixed at a weight ratio of main component: first auxiliary component: second auxiliary component=99:0.5:0.5. To the mixture, polyvinyl butyral, i.e., a binder, and ethanol, i.e., a solvent, were added, and the resulting mixture was mixed with a ball mill to obtain a ceramic slurry. Subsequently, the ceramic slurry was formed into sheets by the doctor blade process to obtain rectangular ceramic green sheets having a thickness of 35 μm.

A conductive paste containing nickel as the primary component was applied by printing on each of the ceramic green sheets to form a conductive paste layer, i.e., a precursor of an internal conductor layer.

The ceramic green sheets provided with the conductive paste layers were then alternately stacked in such a manner that the side faces of the ceramic green sheets at which the conductive paste layers were exposed alternately appeared in the side faces of the stack. A ceramic green sheet not provided with a conductive paste layer was placed on the top of the stack, and the resulting stack was press-bonded to form a green composite.

The green composite was heated at a temperature of 350° C. in an $N_2$ atmosphere to decompose the binder. The resulting composite was then baked at 1,300° C. for 2 hours in a reducing atmosphere, i.e., an $H_2$—$N_2$—$H_2O$ gas at an oxygen partial pressure of $10^{-9}$ to $10^{-12}$ MPa.

Conductive pastes of Samples 1 to 6 for terminal electrodes were prepared as follows. A silver powder, a boron powder (the average particle size D50=16 μm), and a zinc borosilicate glass powder, i.e., an inorganic binder, were dispersed into an organic vehicle containing ethyl cellulose as the resin component with a kneader such as a triple roller to prepare the conductive pastes for terminal electrodes. The paste samples contained 64.8 percent by weight of the silver powder and 1.4 percent by weight of the zinc borosilicate glass powder. The boron powder contents of the paste samples are shown in Table 1.

Comparative Example 1 is a conductive paste for terminal electrodes was prepared as in Samples 1 to 6 but using a boron oxide ($B_2O_3$) powder (the average particle size D50=15 μm) instead of the boron powder.

Next, each of the conductive pastes for terminal electrodes was applied on the side faces of a sintered compact at which internal electrodes are exposed. The applied pastes were baked in air at 800° C. for 1 hour to form terminal electrodes. Each of the terminal electrodes was plated with nickel and then with tin so as to obtain monolithic ceramic capacitors.

The capacitance and the dielectric loss (tan δ) of each of the monolithic ceramic capacitors were measured at a temperature of 20° C., 1 kHz and 1 Vrms. The results are shown in Table 1. In Table 1, the samples marked with an asterisk and the comparative example are outside the scope of the present invention. The rest of the samples are within the scope of the present invention.

TABLE 1

| Sample No. | Boron powder content (wt %) | Capacitance (nF) | Dielectric loss (%) |
|---|---|---|---|
| *1 | 0 | 10.2 | 4.21 |
| 2 | 0.5 | 20.4 | 2.64 |
| 3 | 1.0 | 21.8 | 2.78 |
| 4 | 5.0 | 21.4 | 2.66 |
| *5 | 7.0 | 16.8 | 3.67 |
| *6 | 10.0 | 15.4 | 3.32 |
| Comparative Example 1 | 5.0 (as $B_2O_3$) | 10.6 | 3.86 |

As is apparent from Table 1, the ceramic capacitors of Samples 2 to 4 prepared by using the conductor paste for terminal electrodes of the present invention exhibited superior characteristics, i.e., a capacitance of 20 nF or more and a dielectric loss of 3.0% or less, when compared with Samples 1, 5 and 6 and Comparative Example 1. This is because the boron powder contained in the conductive pastes for terminal electrodes prevented the oxidation of the surface of the nickel internal electrodes. Thus, nickel and silver formed a solid solution, and the nickel internal electrodes were satisfactorily connected to the silver terminal electrodes.

Example 2

Example 2 is explained below using a PTC thermistor as an example of the monolithic ceramic electronic component.

Suitable amounts of starting materials, i.e., $BaCO_3$, $TiO_2$, and $Sm_2O_3$, were prepared so that $(Ba_{0.9998}Sm_{0.0002})TiO_3$ can be formed. Deionized water was added to the prepared powder mixture of the starting material and was mixed and milled with a ball mill using zirconia balls for 16 hours. The resulting mixture was then dried and calcined at 1,200° C. for 2 hours to obtain a calcined powder.

Next, a polyvinyl butyral, i.e., a binder, and ethanol, i.e., a solvent, were added to the calcined powder. The resulting mixture was mixed with a ball mill to obtain a ceramic slurry. The ceramic slurry was formed into sheets by the doctor blade method so as to obtain rectangular ceramic green sheets having a thickness of 35 μm.

On each of the ceramic green sheets, a conductive paste mainly composed of nickel was applied by printing so as to form a conductive paste layer for an internal conductor.

The ceramic green sheets provided with the conductive paste layers were then alternately stacked in such a manner that the side faces of the ceramic green sheets at which the conductive paste layers were exposed alternately appeared in the side faces of the stack. A ceramic green sheet not provided with a conductive paste layer was placed on the top of the stack, and the resulting stack was press-bonded to form a green composite. A nickel paste, which has-been prepared in advance, was applied on the side faces of the green composite and was dried. Subsequently, the green compacts and the nickel paste were baked at 1,200° C. in a reducing atmosphere having a volume ratio $H_2/N_2=0.03$ so as to obtain a sintered compact having nickel side electrodes.

Next, the sintered compact was dipped into an aqueous solution containing glass having a softening point of 500 to 800° C. lower than the baking temperature of the conductive paste described below and a working temperature of 800 to 1,150° C. higher than the baking temperature of the conductive paste described below. The dipped sintered compact was dried and heated at 500 to 600° C. so as to form a glass layer of approximately 0.5 to 5 μm in thickness.

Meanwhile, conductive pastes for terminal electrodes were prepared. A silver powder, a boron powder (the average particle size D50=16 μm) and a zinc borosilicate glass powder, i.e., an inorganic binder, were dispersed into an organic vehicle containing ethyl cellulose as the resin component with a kneader such as a triple roller to prepare Samples 7 to 12 of the conductive pastes for terminal electrodes. The paste samples contained 64.8 percent by weight of the silver powder and 1.4 percent by weight of the zinc borosilicate glass powder. The boron powder contents of the paste samples are shown in Table 2.

Comparative Example 2 is a conductive paste for terminal electrodes was prepared as with Samples 7 to 12 but using a boron oxide ($B_2O_3$) powder (the average particle size D50=15 μm) instead of the boron powder.

Each of the conductive pastes for the terminal electrodes was applied on the nickel side terminals of the sintered compact having glass layers on the surfaces. The resulting sintered compacts were baked in air at 700° C. for 1 hour so as to form terminal electrodes. The terminal electrodes were plated with nickel and then with tin so as to obtain PTC thermistors.

The initial resistance at 25° C. and change in resistance in the temperature range of 130° C. to 150° C., i.e., α=(resistance at 150° C.)/(resistance at 130° C.) of the resulting PTC thermistors were examined. The results are shown in Table 2. Note that in Table 2, the samples marked with an asterisk and the comparative example are outside the scope of the present invention. The rest of the samples are within the scope of the present invention.

TABLE 2

| Sample No. | Boron powder content (wt %) | Initial resistance (Ω) | Change in resistance (α) |
| --- | --- | --- | --- |
| *7 | 0 | 2.80 | 9.5 |
| 8 | 0.5 | 0.12 | 10.2 |
| 9 | 1.0 | 0.10 | 10.4 |
| 10 | 5.0 | 0.08 | 10.2 |
| *11 | 7.0 | 0.07 | 7.4 |
| *12 | 10.0 | 0.05 | 6.2 |
| Comparative Example 2 | 5.0 (as $B_2O_3$) | 2.60 | 6.8 |

As is apparent from Table 2, the PTC thermistors of Samples 8 to 10, which were prepared with the conductive pastes for terminal electrodes of the present invention, exhibited an initial resistance at 25° C. of 0.1 Ω±20%, and the resistance did not increase due to the formation of the terminal electrodes. Moreover, the change in resistance (α) in the temperature range of 130 to 150° C. was large, i.e., 10 or more. The PTC thermistors of Samples 8 to 10 exhibited characteristics superior to those of Samples 7, 11 and 12, and Comparative Example 2. This is because the boron powder contained in the conductive pastes prevented the oxidation of the surfaces of the nickel internal electrodes and the nickel side electrodes. As a result, nickel and silver formed a solid solution, and the nickel internal electrodes were satisfactorily connected to the silver terminal electrodes.

Note that Examples 1 and 2 above used a silver powder as a conductive powder in the conductive paste for terminal electrodes. The same effects can be obtained even with a silver alloy powder, i.e., an alloy powder containing silver as the primary component.

What is claimed is:

1. A monolithic ceramic electronic component made by the method comprising:
   providing a sintered compact having internal conductor layers comprising nickel and having on an external face in electrical contact with internal conductor layers, a conductive paste comprising at least one of a silver powder and a silver alloy powder; a boron powder in an amount of at least about 0.5 percent by weight and less than about 7.0 percent by weight of the total weight of the conductive paste; an inorganic binder; and an organic vehicle; and
   baking the conductive paste to form terminal electrodes electrically connected to the internal conductor layers of the sintered compact.

2. The monolithic ceramic electronic component according to claim 1, wherein the inorganic binder is at least one selected from the group consisting of bismuth borate glass, bismuth borosilicate glass and zinc borosilicate glass.

3. The monolithic ceramic electronic component according to claim 2, wherein the inorganic binder is lead free.

4. The monolithic ceramic electronic component according to claim 3, wherein the average particle diameter of the boron powder is about 60 μm or less.

5. The monolithic ceramic electronic component according to claim 4, wherein the amount of the inorganic binder is about 1 to 20 percent by volume of the total volume of the inorganic binder, said at least one of the silver powder and the silver alloy powder, and the boron powder.

6. The monolithic ceramic electronic component according to claim 1, wherein the amount of the inorganic binder is about 1 to 20 percent by volume of the total volume of the inorganic binder, said at least one of the silver powder and the silver alloy powder, and the boron powder.

7. The monolithic ceramic electronic component according to claim 1, wherein the boron powder has an average particle diameter of about 60 μm or less.

8. The monolithic ceramic electronic component according to claim 1, wherein the conductive paste is lead free.

9. The monolithic ceramic electronic component according to claim 1, wherein the layers of the sintered compact other than the internal conductor layers are dielectric, and the monolithic ceramic electronic component is a monolithic ceramic capacitor.

10. The monolithic ceramic electronic component according to claim 1, wherein the layers of the sintered compact other than the internal conductor layers are semiconductive and the monolithic ceramic electronic component is a monolithic positive temperature coefficient thermistor.

11. The monolithic ceramic electronic component according to claim 1, wherein the conductive paste is baked at a temperature of about 400 to 900° C.

12. The monolithic ceramic electronic component of claim 11, wherein the method further comprising:
preparing ceramic green sheets;
forming a precursor of an internal conductor layer of nickel or a material containing nickel as a primary component on each of the ceramic green sheets;
stacking the ceramic green sheets to form a composite;
sintering the composite to form the sintered compact; and
applying said paste to an external surface of the sintered compact in electrical contact with the internal conductor layer.

13. The monolithic ceramic electronic component of claim 1, further comprising:
preparing ceramic green sheets;
forming a precursor of an internal conductor layer of nickel or a material containing nickel as a primary component on each of the ceramic green sheets;
stacking the ceramic green sheets to form a composite;
sintering the composite to form the sintered compact; and
applying said paste to an external surface of the sintered compact in electrical contact with the internal conductor layer.

14. A monolithic ceramic electronic component comprising a sintered compact of a plurality of ceramic layers having therein an internal conductor layer comprising nickel and having on an external face a terminal electrode comprising silver and boron in electrical contact with the internal conductor layer, wherein at least of portion of the nickel and silver are in solid solution.

15. The monolithic ceramic electronic component of claim 14, having a pair of internal conductor layers and a pair of separated terminal electrodes, wherein each of the internal conductor layers is in electrical contact with a different terminal electrode.

16. The monolithic ceramic electronic component of claim 15, wherein the pair of internal conductor layers sandwich a dielectric ceramic layer and the monolithic ceramic electronic component is a monolithic ceramic capacitor.

17. The monolithic ceramic electronic component according to claim 15, wherein the pair of internal conductor layers sandwich a semiconductive ceramic layer and the monolithic ceramic electronic component is a monolithic positive temperature coefficient thermistor.

* * * * *